(12) United States Patent
Seo et al.

(10) Patent No.: US 9,299,763 B2
(45) Date of Patent: Mar. 29, 2016

(54) THIN FILM TRANSISTOR ARRAY SUBSTRATE AND METHOD OF MANUFACTURING THE SAME

(71) Applicant: LG DISPLAY CO., LTD., Seoul (KR)

(72) Inventors: Hyun-Sik Seo, Goyang-si (KR);
Jong-Woo Kim, Paju-si (KR);
Chung-Ho Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/109,339

(22) Filed: Dec. 17, 2013

(65) Prior Publication Data
US 2014/0353661 A1    Dec. 4, 2014

(30) Foreign Application Priority Data
May 30, 2013    (KR) .................. 10-2013-0061694

(51) Int. Cl.
*H01L 27/32* (2006.01)
*H01L 29/786* (2006.01)
*G02F 1/1362* (2006.01)
*H01L 29/45* (2006.01)
*H01L 27/12* (2006.01)
*H01L 29/66* (2006.01)

(52) U.S. Cl.
CPC .......... *H01L 27/3279* (2013.01); *H01L 27/124* (2013.01); *H01L 27/1244* (2013.01); *H01L 29/45* (2013.01); *H01L 29/66765* (2013.01); *H01L 29/66969* (2013.01); *H01L 29/7869* (2013.01); *H01L 29/78648* (2013.01); *H01L 29/78669* (2013.01); *H01L 29/78678* (2013.01); *G02F 2001/13629* (2013.01)

(58) Field of Classification Search
CPC .................................................... H01L 27/3279
See application file for complete search history.

(56) References Cited

U.S. PATENT DOCUMENTS

| | | | |
|---|---|---|---|
| 2008/0237582 A1* | 10/2008 | Cho et al. ........................ | 257/40 |
| 2009/0206332 A1 | 8/2009 | Son et al. | |
| 2009/0212290 A1* | 8/2009 | Youn et al. ..................... | 257/59 |
| 2009/0212291 A1 | 8/2009 | Ikeda | |
| 2009/0283762 A1 | 11/2009 | Kimura | |
| 2010/0032708 A1* | 2/2010 | Fujikawa et al. ............... | 257/99 |
| 2010/0224880 A1 | 9/2010 | Kimura | |
| 2010/0244029 A1 | 9/2010 | Yamazaki et al. | |
| 2012/0043545 A1* | 2/2012 | Kim et al. ....................... | 257/59 |
| 2012/0313093 A1 | 12/2012 | Kim et al. | |

* cited by examiner

Primary Examiner — Daniel Luke
(74) Attorney, Agent, or Firm — Dentons US LLP (57) ABSTRACT

A thin film transistor (TFT) array substrate is disclosed. The TFT array substrate includes a gate line, a first gate electrode branched from the gate line, a gate insulating film formed over the substrate, an active layer formed on the gate insulating film, a data line formed to comprise a plurality of metal layers including a first metal layer and a second metal layer formed of copper (Cu), a source electrode formed on the gate insulating film to comprise the remaining metal layer excluding the second metal layer among the plurality of the metal layers, and a drain electrode formed on the gate insulating film to comprise the remaining metal layer excluding the second metal layer among the plurality of the metal layers.

13 Claims, 9 Drawing Sheets

THIN FILM TRANSISTOR ARRAY SUBSTRATE AND METHOD OF MANUFACTURING THE SAME

CROSS-REFERENCE TO RELATED APPLICATIONS

This application claims the benefit of Korean Patent Application No. 10-2013-0061694, filed on May 30, 2013, which is hereby incorporated by reference for all purposed as if fully set forth herein.

BACKGROUND OF THE INVENTION

1. Field of the Invention

The present invention relates to a thin film transistor array substrate included in an active matrix driving type display device. More particularly, the present invention relates to a thin film transistor array substrate with enhanced reliability and a method of manufacturing the same.

2. Discussion of the Related Art

With the advent of the information era, the field of displays, which visually display electrical information signals, has rapidly developed. Thus, research into a method of developing ultra-thin and more lightweight flat display devices with lower power consumption is continuously underway.

Examples of such flat panel display devices include a liquid crystal display (LCD) device, a plasma display panel (PDP) device, a field emission display (FED) device, an electroluminescent display (ELD) device, an electro-wetting display (EWD) device, and an organic light emitting display (OLED) device.

Such flat panel display devices necessarily include flat panel display panels to display an image. A flat panel display panel has a structure in which a pair of substrates is adhered opposite each other with a luminescent or polarizing material disposed therebetween.

Among these display devices, in an active matrix display device, which individually drives a plurality of pixels, any one of the pair of substrates may generally include a thin film transistor (TFT) array substrate.

A general TFT array substrate includes gate lines and data lines that cross each other so as to define a plurality of pixel region. A plurality of TFTs correspond to the pixel regions and are formed at the crossings of the gate lines and the data lines.

As an area of a display device increases, resistance of signal lines such as gate lines and data lines may considerably affect power consumption of the display device. Thus, it is necessary to minimize the resistance of the signal lines. For example, at least one of a gate line and a data line may have at least one stacked structure including copper (Cu) so that the at least one thereof has a low resistance.

However, Cu is a metal with high ductility and thus Through Migration of Cu may easily occur. For reference, the Through Migration of Cu is that a horn of Cu occurred from a layer of Cu penetrates an insulating film which covers the layer of Cu along a weak portion of the insulating film.

In particular, when a TFT is of a multi-gate type including an upper gate electrode formed above an active layer and a lower gate electrode below the active layer, defects in the TFT due to the Through Migration of Cu easily occur.

In particular, source and drain electrodes as well as data lines have a stacked structure including the layer of Cu, and the upper gate electrode above the active layer is formed on an insulating film covering the data lines and the source and drain electrodes so as to be insulated from the source and drain electrodes.

In this regard, the source and drain electrodes include at least the layer of Cu, and a height difference due to the source and drain electrodes is formed. Thus, the insulating film on the source and drain electrodes may be formed more weakly in a height change region due to the source and drain electrodes than in the other region and, accordingly, the Through Migration of Cu may easily occur. Due to such Through Migration of Cu, when the upper gate electrode and any one of the source and drain electrodes are short-circuited, the TFT is unable to serve as a switch and bright spot defects occur in the display device and thus there are limitations in enhancing reliability and yield of TFT array substrates.

SUMMARY OF THE INVENTION

Accordingly, the present invention is directed to a thin film transistor array substrate and a method of manufacturing the same that substantially obviate one or more problems due to limitations and disadvantages of the related art.

An object of the present invention is to provide a thin film transistor array substrate that includes signal lines having a stacked structure including a layer of Cu in order to have a relatively low resistance and prevents short-circuit between the a gate electrode and any one of source and drain electrodes due to Through Migration of Cu and thus has enhanced reliability and yield and a method of manufacturing the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a thin film transistor (TFT) array substrate includes a substrate, a gate line formed on the substrate, a first gate electrode formed on the substrate to be branched from the gate line, a gate insulating film formed over the substrate so as to cover the gate line and the first gate electrode, an active layer formed on the gate insulating film so as to overlap with at least a portion of the first gate electrode, a data line formed on the gate insulating film to intersect the gate line, and to comprise a plurality of metal layers comprising a first metal layer and a second metal layer formed of copper (Cu), a source electrode formed on the gate insulating film to be branched from the data line so as to overlap with a first side of the active layer, and to comprise the remaining metal layer excluding the second metal layer among the plurality of the metal layers, and a drain electrode formed on the gate insulating film to be spaced apart from the source electrode so as to overlap with a second side of the active layer, and to comprise the remaining metal layer excluding the second metal layer among the plurality of the metal layers.

In another aspect of the present invention, a method of manufacturing a TFT array substrate includes forming a gate line and a first gate electrode branched from the gate line on a substrate, forming a gate insulating film covering the gate line and the first gate electrode over the substrate, forming an active layer overlapping with at least a portion of the first gate electrode on the gate insulating film, forming a plurality of metal layers including a first metal layer and a second metal layer formed of Cu on the gate insulating film, and forming a data line, a source electrode and a drain electrode on the gate insulating film by differently patterning the plurality of the metal layers, the data line intersecting the gate line, the source electrode branched from the data line and overlapping with a first side of the active layer, and the drain electrode spaced apart from the source electrode and overlapping with a second side of the active layer.

In the forming of the data line, the source electrode and drain electrode, the data line may be formed to comprise the plurality of the metal layers and each of the source electrode and the drain electrode may be formed to comprise the remaining metal layer excluding the second metal layer among the plurality of the metal layers.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, the same reference numbers will be used throughout the drawings to refer to the same or like parts.

Hereinafter, a thin film transistor (TFT) array substrate and a method of manufacturing the same according to embodiments of the present invention will be described in detail with reference to the accompanying drawings.

A TFT array substrate according to an embodiment of the present invention will be described with reference to FIGS. 1 and 2.

Figure 1:
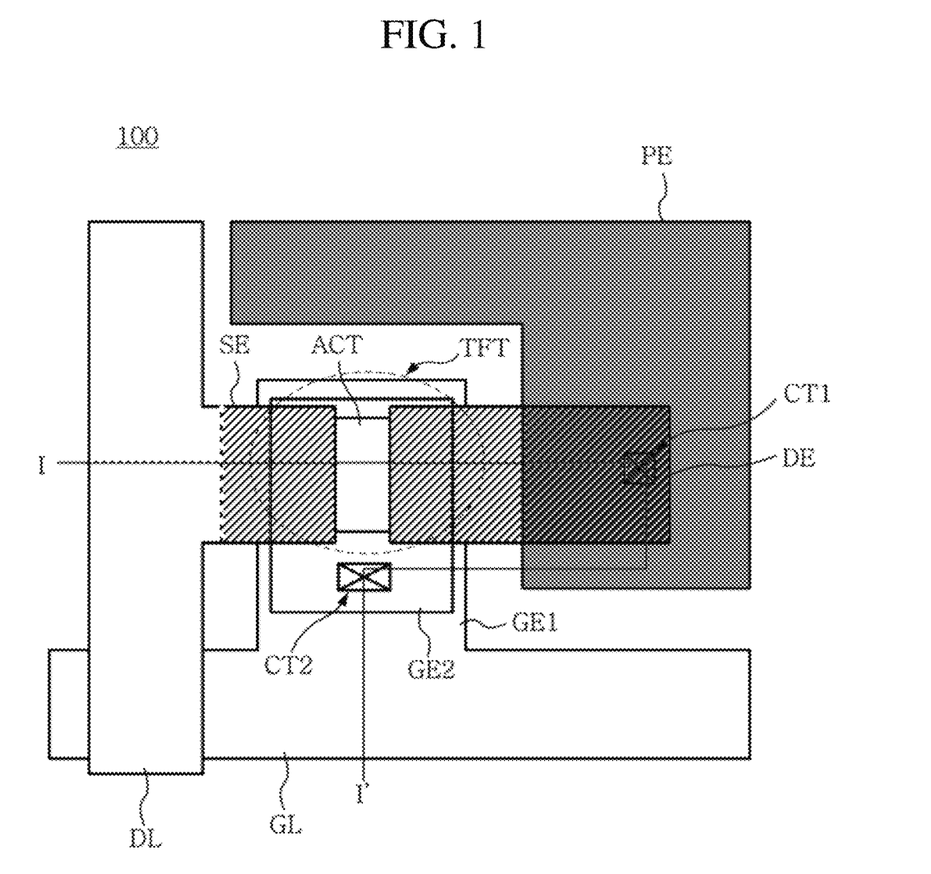
FIG. 1 is a partial plan view of a thin film transistor (TFT) array substrate according to an embodiment of the present invention.

FIG. 1 is a partial plan view of a TFT array substrate 100 according to an embodiment of the present invention. FIG. 2 is a sectional view taken along line I-I' of FIG. 1.

As illustrated in FIG. 1, the TFT array substrate 100 according to the embodiment of the present invention includes gate lines GL and data lines DL crossing each other so as to define a plurality of pixel regions, a TFT formed at each of the crossings of the gate lines GL and the data lines DL to correspond to each pixel region, and a pixel electrode PE connected to each TFT.

The TFT includes a first gate electrode GE1 branched from a gate line GL, an active layer ACT formed so as to overlap with at least a portion of the first gate electrode GE1, a source electrode SE branched from a data line DL and formed so as to overlap with a first side of the active layer ACT, a drain electrode DE spaced apart from the source electrode SE and formed so as to overlap with a second side of the active layer ACT, and a second gate electrode GE2 formed so as to overlap with at least a portion of an upper surface of the active layer ACT.

The pixel electrode PE is connected to the drain electrode DE via a first contact hole CT1 that exposes at least a portion of the drain electrode DE.

The second gate electrode GE2 is connected to the first gate electrode GE1 and the gate line GL via a second contact hole CT2 that exposes at least a portion of any one of the first gate electrode GE1 and the gate line GL.

In addition, the active layer ACT overlaps with at least a portion of the first gate electrodes GE1 and at least a portion of the second gate electrode GE2 and includes a channel region that forms a channel based on a gate voltage applied via the gate line GL. That is, at least a channel region of the active layer ACT is disposed between the first and second gate electrodes GE1 and GE2.

Figure 2:
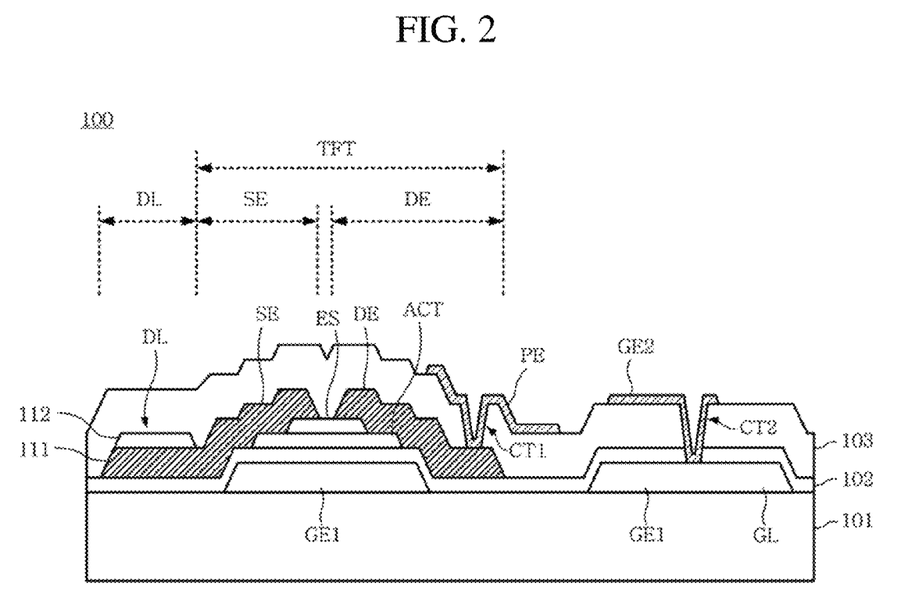
FIG. 2 is a sectional view taken along line I-I' of FIG. 1.

In particular, as illustrated in FIG. 2, the TFT array substrate 100 includes a substrate 101, the gate line GL formed on the substrate 101, the first gate electrode GE1 formed on the substrate 101 to be branched from the gate line GL, a gate insulating film 102 formed over the substrate 101 so as to cover the gate line GL and the first gate electrode GE1, the active layer ACT formed on the gate insulating film 102 so as to overlap with at least a portion of the first gate electrode GE1, the data line DL formed on the gate insulating film 102 so as to intersect the gate line GL, the source electrode SE formed on the gate insulating film 102 to be branched from the data line DL so as to overlap with a first side of the active layer ACT, the drain electrode DE formed on the gate insulating film 102 to be spaced apart from the source electrode SE so as to overlap with a second side of the active layer ACT, an interlayer insulating film 103 formed over the gate insulating film 102 so as to cover the data line DL, the source electrode SE and the drain electrode DE, the pixel electrode PE formed on the interlayer insulating film 103 so as to overlap with a portion of the drain electrode DE, and the second gate electrode GE2 formed on the interlayer insulating film 103 so as to overlap with a portion of the first gate electrode GE1 and at least a portion of the active layer ACT.

The active layer ACT may be formed of any one of an oxide semiconductor, polysilicon (crystalline silicon), and amorphous silicon (a-Si).

In this regard, the oxide semiconductor has the formula $A_xB_yC_zO$ where x, y, z≥0, wherein each of A, B and C is independently selected from Zn, Cd, Ga, In, Sn, Hf, and Zr. For example, the oxide semiconductor may be one selected from In—Ga—Zn—Oxide (IGZO), In—Sn—Zn—Oxide (ITZO), and In—Ga—Oxide (IGO).

When the TFT array substrate 100 includes the active layer ACT formed of the oxide semiconductor, the TFT array substrate 100 further includes an etch stopper ES formed on the active layer ACT so as to cover a separation region between the source electrode SE and the drain electrode DE. The etch stopper ES serves to prevent loss of semiconductor characteristics of the oxide semiconductor of the active layer ACT due to exposure to an etchant or an etching gas in a process of forming the source electrode SE and the drain electrode DE.

Although not shown, when the active layer ACT is formed of poly-Si or a-Si, the etch stopper ES may be omitted.

The data line DL is formed on the gate insulating film 102 to comprise a plurality of metal layers including first and second metal layers 111 and 112.

In this regard, the first metal layer 111 may be formed of a metal having high adhesiveness with the gate insulating film 102 and a relatively low resistance. For example, the first metal layer 111 may be formed of any one of molybdenum-titanium (MoTi), Mo, Ti, and chromium (Cr).

In addition, the second metal layer 112 serves to further reduce the resistance of the data line DL and is formed of copper (Cu) having a low resistance. The second metal layer 112 is positioned a top among the plurality of the metal layers.

As such, since the data line DL includes the metal layers including the first metal layer 111 and the second metal layer 112 formed of Cu, the data line DL may have a low resistance and thus large-scale fabrication of the TFT array substrate 100 may be more easily achieved.

Each of the source electrode SE and the drain electrode DE is formed on the gate insulating film 102 as in the data line DL. Unlike the data line DL, however, each of the source electrode SE and the drain electrode DE includes only the remaining metal layer excluding the second metal layer 112 formed of Cu among the plurality of metal layers (e.g., first and second metal layers 111 and 112). For example, as illustrated in FIG. 2, each of the source electrode SE and the drain electrode DE may include the first metal layer 111 as a single layer.

As such, the source electrode SE and the drain electrode DE are metal patterns with smaller areas than that of the data line DL and thus height change regions due to the source electrode SE and the drain electrode DE are occurred more frequently than that due to the data line DL. Thus, when each of the source electrode SE and the drain electrode DE includes the second metal layer 112 formed of Cu, it is preferred in terms of low resistance, but Through Migration of Cu easily occurs. Such Through Migration of Cu causes short circuit defects such as interconnection between any one of the source electrode SE and the drain electrode DE and other conductive layers formed thereabove, i.e., the pixel electrode PE, the second gate electrode GE2, and the like, through the interlayer insulating film 103 covering the source electrode SE and the drain electrode DE and thus reliability and yield of the TFT array substrate 100 are reduced. In addition, when the TFT array substrate 100 is applied to a display device, such short circuit defects of TFTs cause bright spot defects, which results in reduced reliability and yield of the display device.

Therefore, according to one embodiment of the present invention, unlike the data line DL, each of the source electrode SE and the drain electrode DE includes only the remaining metal layer excluding the second metal layer 112 formed of Cu among the metal layers, e.g., first and second layers 111 and 112. Accordingly, in the height change region due to each of the source electrode SE and the drain electrode DE, the Through Migration of Cu is prevented and thus short circuit defects in TFTs may be reduced, whereby reliability of the TFT array substrate 100 may be enhanced.

As described above, the data line DL includes a plurality of metal layers including the first metal layer 111 disposed on the gate insulating film 102 and the second metal layer 112 disposed below the interlayer insulating film 103. That is, although not shown in FIG. 2, the data line DL may include at least three metal layers including the first and second metal layers 111 and 112 and at least one different metal layer disposed therebetween. In this case, each of the source electrode SE and the drain electrode DE includes the remaining metal layers excluding the second metal layer 112 formed of Cu among the metal layers.

In addition, the interlayer insulating film 103 may be formed of at least one of $SiN_x$ and $SiO_y$.

The pixel electrode PE is connected to the drain electrode DE via the first contact hole CT1 that penetrates the interlayer insulating film 103 to expose at least a portion of the drain electrode DE.

The second gate electrode GE2 is connected to the first gate electrode GE1 and the gate line GE via the second contact hole CT2 that penetrates the gate insulating film 102 and the interlayer insulating film 103 to expose at least a portion of any one of the first gate electrode GE1 and the gate line GE.

In summary, the TFT array substrate 100 according to the embodiment of the present invention includes the data line DL including the plurality of the metal layers including the first and second metal layers 111 and 112 so as to have a relatively low resistance and thus may be suited to large-scale fabrication. In addition, the TFT array substrate 100 includes the source electrode SE and the drain electrode DE, each of which includes the remaining metal layer excluding the second metal layer 112 formed of Cu among the plurality of the metal layers and thus short circuit due to Through Migration of Cu is prevented, whereby the TFT array substrate 100 and a display device including the same may have increased reliability and yield.

Hereinafter, a method of manufacturing the thin film transistor array substrate according to an embodiment of the present invention will be described with reference to FIGS. 5A to 5E, 6A to 6D, and 7A to 7C.

Figure 3:
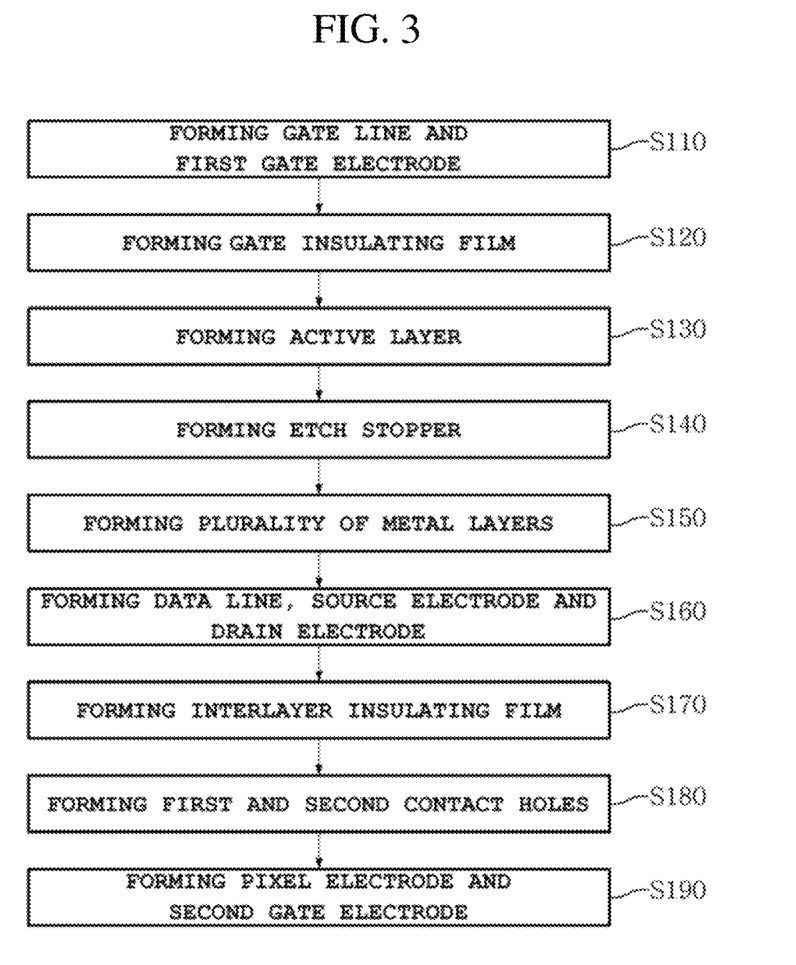
FIG. 3 is a flowchart illustrating a TFT array substrate manufacturing method according to an embodiment of the present invention.
Figure 4:
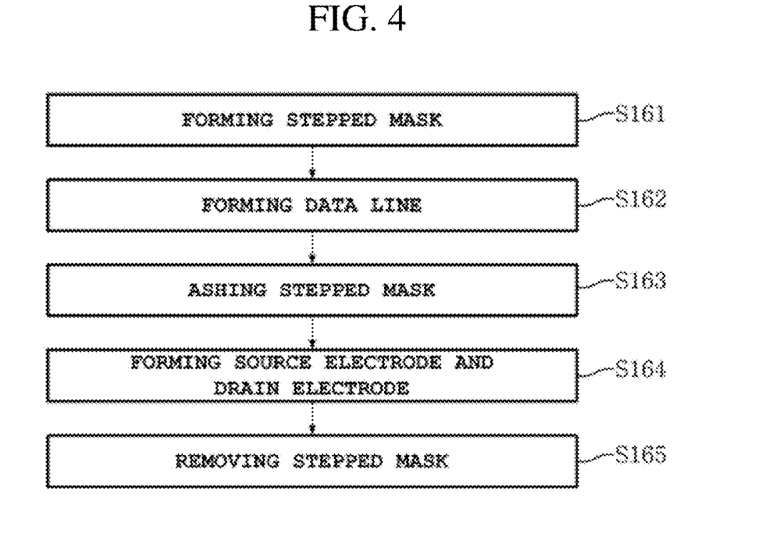
FIG. 4 is a flowchart illustrating a step of forming a data line, a source electrode, and a drain electrode illustrated in FIG. 3.

FIG. 3 is a flowchart illustrating a TFT array substrate manufacturing method according to an embodiment of the present invention. FIG. 4 is a flowchart illustrating a step of forming a data line, a source electrode, and a drain electrode illustrated in FIG. 3. FIGS. 5A to 5E, 6A to 6D, and 7A to 7C are views illustrating each of the steps illustrated in FIGS. 3 and 4.

As illustrated in FIG. 3, the TFT array substrate manufacturing method according to an embodiment of the present invention includes forming a gate line and a first gate electrode branched from the gate line on a substrate (step S110), forming a gate insulating film over the substrate so as to cover the gate line and the first gate electrode (step S120), forming an active layer on the gate insulating film so as to overlap with at least a portion of the first gate electrode (step S130), forming a plurality of metal layers including a first metal layer and a second metal layer formed of Cu on the gate insulating film (step S140), forming an etch stopper covering a partial region of the active layer (step S150), forming a data line, a source electrode and a drain electrode on the gate insulating film by differently patterning the metal layers, the data line intersecting the gate line, the source electrode branched from the data line and overlapping with a first side of the active layer, and the drain electrode spaced apart from the source electrode and overlapping with a second side of the active layer (step S160), forming an interlayer insulating film covering the data line, the source electrode, and the drain electrode over the gate insulating film (step S170), forming a first contact hole and a second contact hole, the first contact hole penetrating the interlayer insulating film to expose at least a portion of the drain electrode, and the second contact hole penetrating the interlayer insulating film and the gate insulating film to expose at least a portion of the first gate electrode (step S180), and forming a pixel electrode and a second gate electrode on the interlayer insulating film, the pixel electrode connected to the drain electrode via the first contact hole, and the second gate electrode connected to the first gate electrode via the second contact hole and overlapping with at least a portion of the active layer (step S190).

In addition, as illustrated in FIG. 4, formation of the data line, the source electrode, and the drain electrode (step S160) includes forming a stepped mask on the plurality of the metal layers, wherein the stepped mask comprises a first pattern region corresponding to the data line and having a first thickness and a second pattern region corresponding to the source and drain electrodes and having a second thickness that is smaller than the first thickness (step S161), forming the data line by patterning the plurality of the metal layers using the stepped mask (step S162), removing the second pattern region by ashing the stepped mask and forming the first pattern region to a third thickness that is smaller than the first thickness (step S163), forming the source and drain electrodes by patterning the second metal layer of the metal layers using the first pattern region having the third thickness (step S164), and removing the first pattern region having the third thickness (step S165).

Figure 5A:
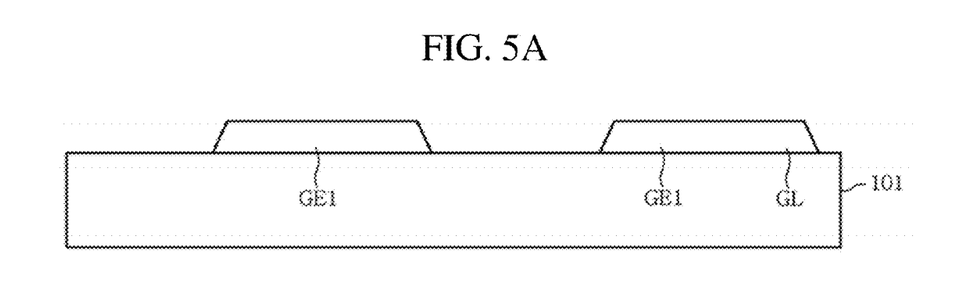
FIGS. 5A to 5E, 6A to 6D, and 7A to 7C are views illustrating each of the steps illustrated in FIGS. 3 and 4.

As illustrated in FIG. 5A, the gate line GL and the first gate electrode GE1 are formed on the substrate 101 (step S110). The first gate electrode GE1 is formed to branch from the gate line GL.

Figure 5B:
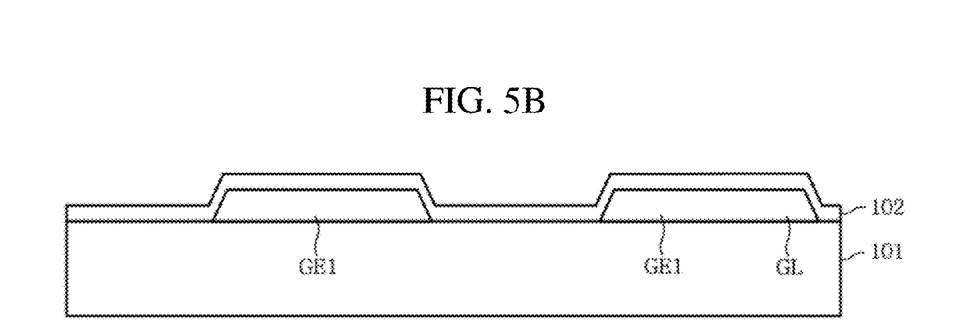

As illustrated in FIG. 5B, the gate insulating film 102 covering the gate line GL and the first gate electrode GE1 is formed over the substrate 101 (step S120).

Figure 5C:
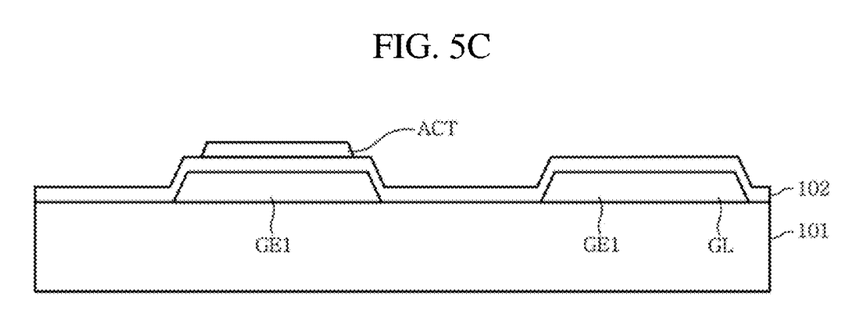

As illustrated in FIG. 5C, the active layer ACT overlapping with at least a portion of the first gate electrode GE1 is formed on the gate insulating film 102 (step S130). In this regard, at least a channel region of the active layer ACT overlaps with the first gate electrode GE 1.

In addition, the active layer ACT may be formed of any one of an oxide semiconductor, poly-Si (crystalline silicon), and amorphous silicon (a-Si).

Figure 5D:
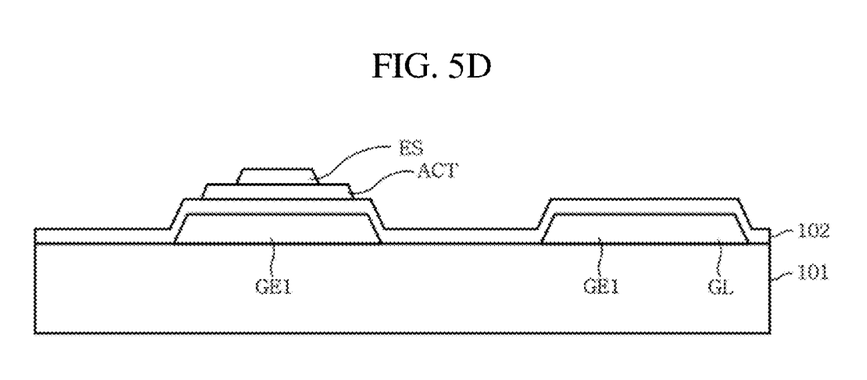

As illustrated in FIG. 5D, the etch stopper ES is formed on the active layer ACT to protect the active layer ACT (step S140) and severs to prevent the active layer ACT from being exposed to an etchant or an etching gas in the subsequent step of forming the source electrode SE and the drain electrode DE (step S160).

Although not shown, formation of the etch stopper ES (step S140) may be omitted to reduce the number of manufacturing processes when the active layer ACT is formed of a semiconductor material that enables the active layer ACT to maintain relatively stable semiconductor properties even when exposed to an etchant or an etching gas, e.g., poly-Si (crystalline silicon) or a-Si.

Figure 5E:
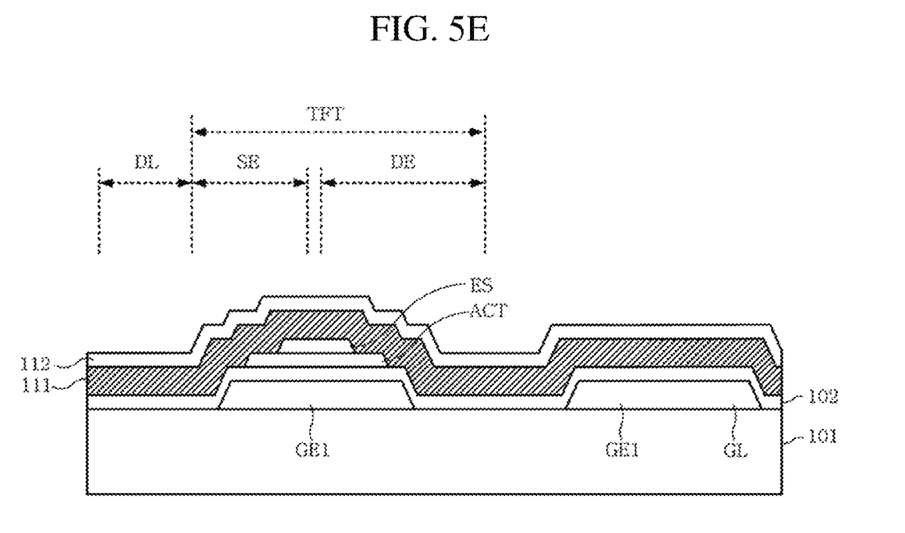

As illustrated in FIG. 5E, a plurality of metal layers including the first and second metal layers 111 and 112 is formed over the gate insulating film 102 (step S150).

The first metal layer 111 is formed on the gate insulating film 102 and may be formed of a metal having high adhesiveness with the gate insulating film 102 and a relatively low resistance. For example, the first metal layer 111 may be formed of any one of MoTi, Mo, Ti, and Cr.

The second metal layer 112 is a layer corresponding to the uppermost layer of the metal layers including the first and second metal layers 111 and 112 and formed of Cu having a low resistance. The second metal layer 112 serves to further reduce the resistance of the data line DL.

The metal layers including the first and second metal layers 111 and 112 are formed so as to cover the active layer ACT, or the active layer ACT and the etch stopper ES when the etch stopper ES is formed on the active layer ACT.

Although not shown, the metal layers may further include other metal layers disposed between the first and second metal layers 111 and 112, in addition to the first and second metal layers 111 and 112.

Figure 6A:
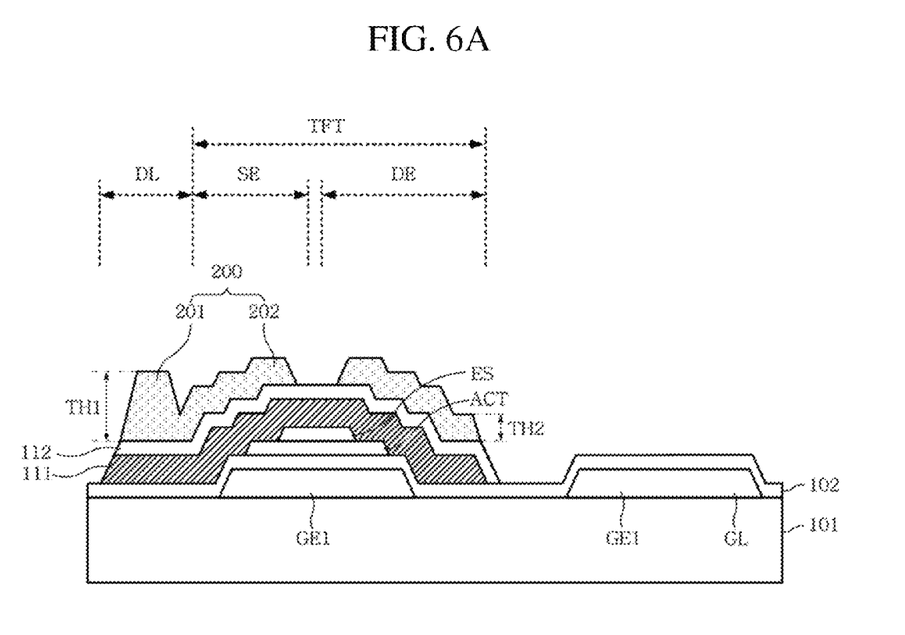

As illustrated in FIG. 6A, a stepped mask 200 is formed on the metal layers including the first and second metal layers 111 and 112 (step S161).

The stepped mask 200 includes a first pattern region 201 corresponding to the data line DL and having a first thickness TH1 and a second pattern region 202 corresponding to the source electrode SE and the drain electrode DE and having a second thickness TH2 that is smaller than the first thickness TH1.

The stepped mask 200 may be formed by performing differential patterning upon a photoresist material (not shown) on the metal layers including the first and second metal layers 111 and 112 using a halftone mask or by diffractive light exposure.

Subsequently, the plurality of the metal layers including at least the first and second metal layers 111 and 112 are patterned using the stepped mask 200. As a result, the data line DL including the plurality of the metal layers is formed below the first pattern region 201 (step S162).

Figure 6B:
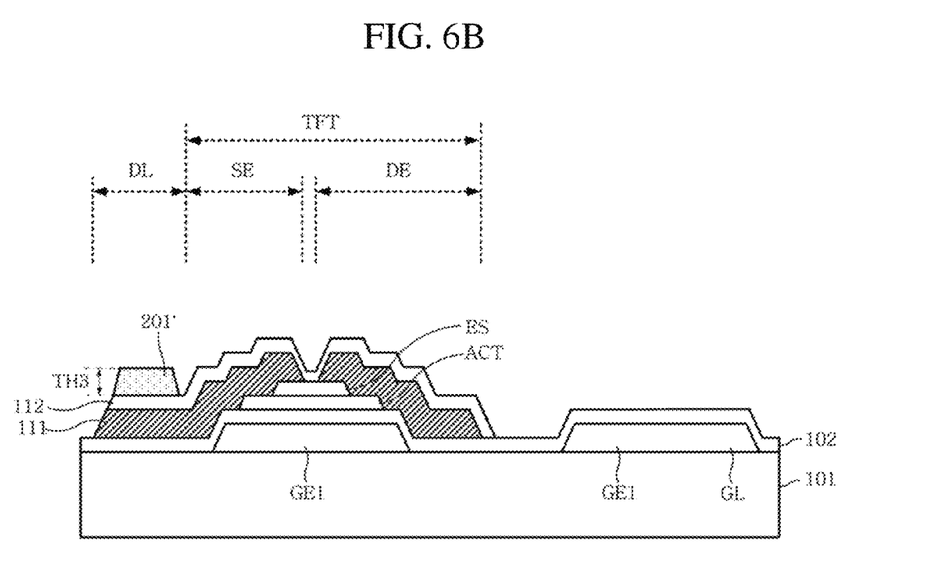

As illustrated in FIG. 6B, the stepped mask 200 is ashed to remove the second pattern regions 202 (see FIG. 6A) and a first pattern region 201' is formed to a third thickness TH3 that is smaller than the first thickness TH1 (see FIG. 6A) (step S163).

Figure 6C:
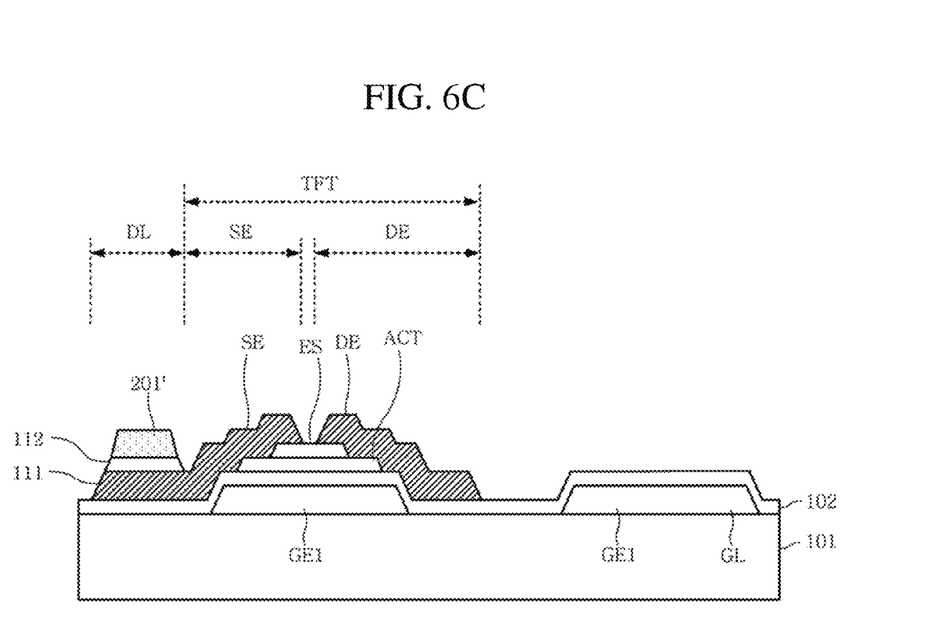

As illustrated in FIG. 6C, only the second metal layer 112 formed of Cu, which is the uppermost layer among the plurality of the metal layers, is patterned using the first pattern region 201' having the third thickness TH3. As a result, the data line DL including the plurality of the metal layers remains due to the first pattern region 201' and the source electrode SE and the drain electrode DE including the remaining metal layer excluding the second metal layer 112 among the plurality of the metal layers are formed (step S164).

Figure 6D:
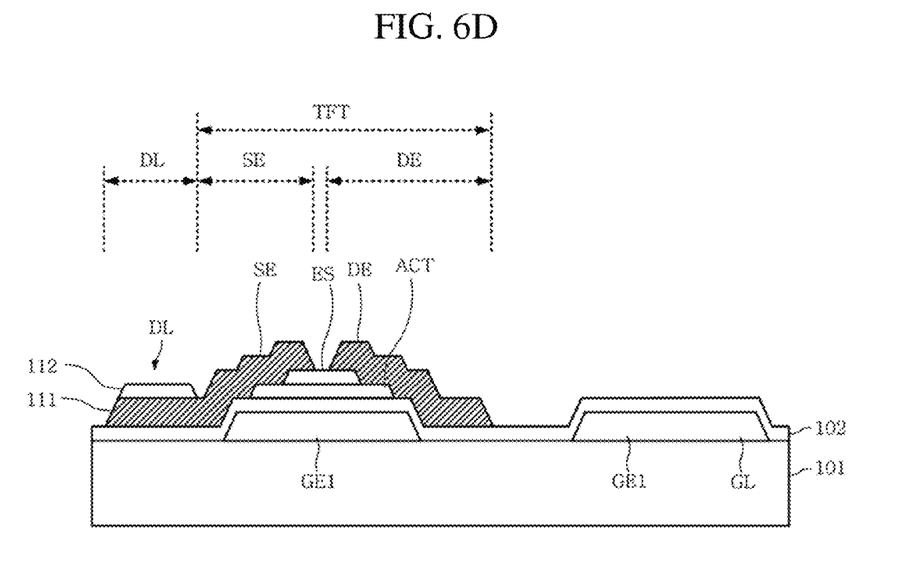

As illustrated in FIG. 6D, the first pattern region 201' having the third thickness TH3 remaining on the data line DL is removed (step S165).

Figure 7A:
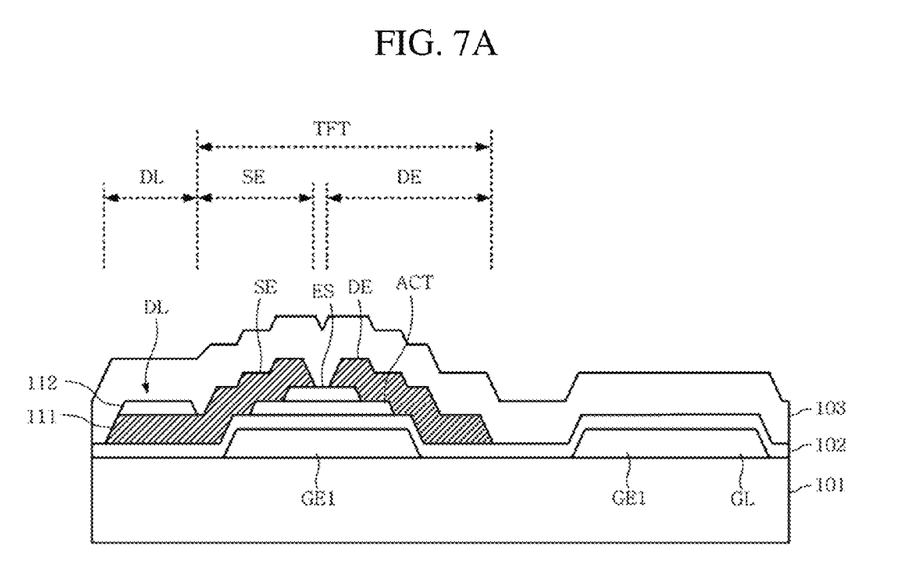

Subsequently, as illustrated in FIG. 7A, the interlayer insulating film 103 covering the data line DL, the source electrode SE, and the drain electrode DE is formed over the gate insulating film 102 (step S170).

Figure 7B:
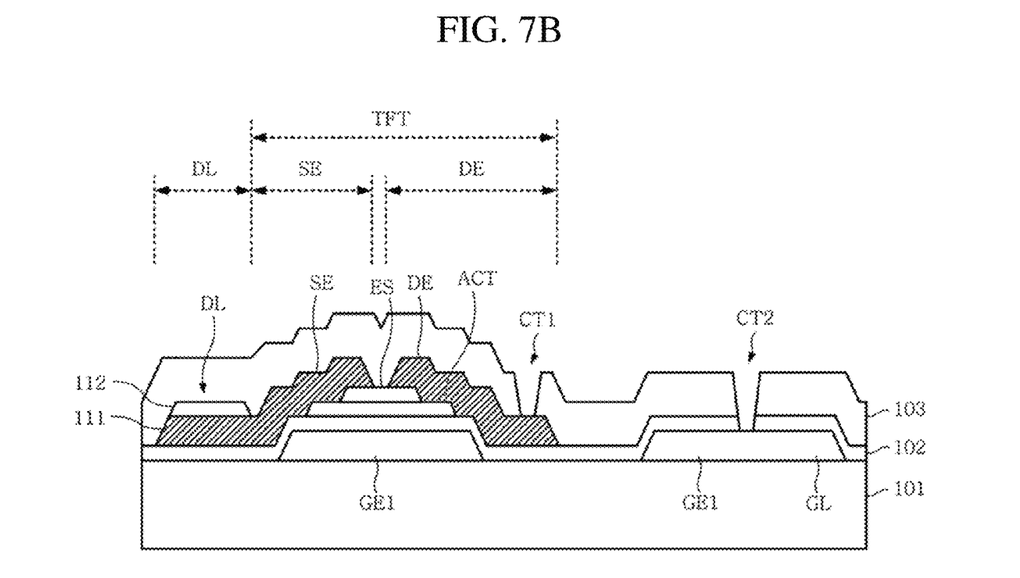

As illustrated in FIG. 7B, the first contact hole CT1 penetrating the interlayer insulating film 103 to expose at least a portion of the drain electrode DE is formed, and the second contact hole CT2 penetrating the gate insulating film 102 and the interlayer insulating film 103 to expose at least a portion of any one of the first gate electrode GE1 and the gate line GL is formed (step S180).

Figure 7C:
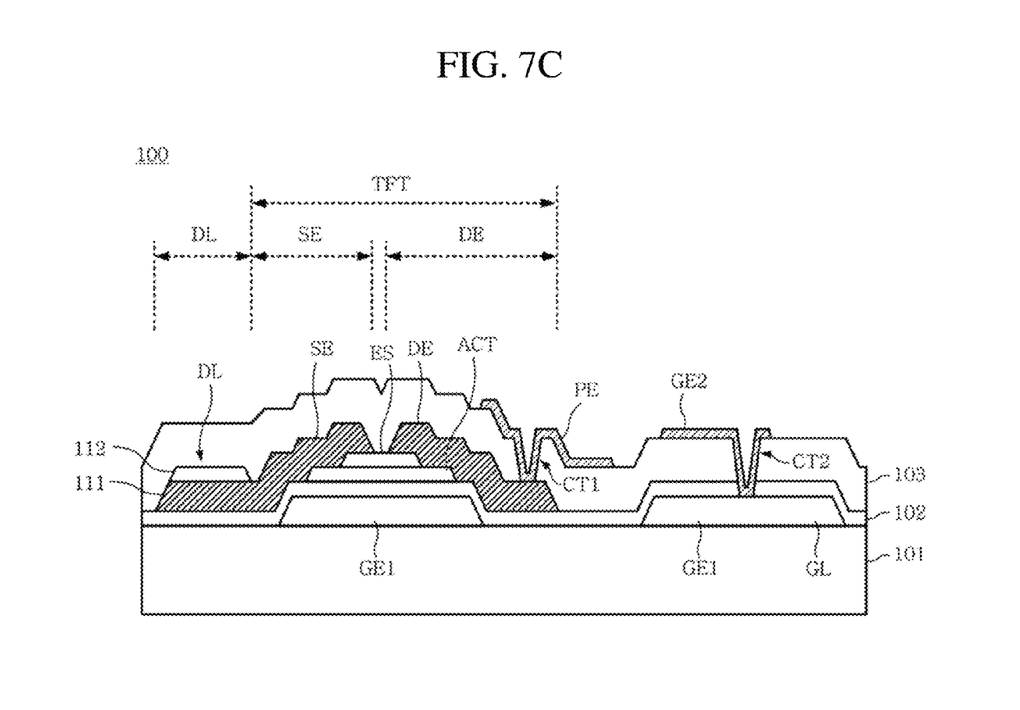

Subsequently, as illustrated in FIG. 7C, the pixel electrode PE and the second gate electrode GE2 are formed on the interlayer insulating film 103 (step S190).

The pixel electrode PE is connected to the drain electrode DE via the first contact hole CT1, and the second gate electrode GE2 is connected to the gate line GL and the first gate electrode GE1 via the second contact hole CT2.

As described above, in the TFT array substrate manufacturing method according to the embodiment of the present invention, the data line DL including the plurality of the metal layers including at least the first and second metal layers 111 and 112 and the source and drain electrodes SE and DE including the remaining metal layer excluding the second metal layer 112 among the plurality of the metal layers are formed using a single mask process, and thus, reduction in reliability and yield of the TFT array substrate due to Through Migration of Cu that may frequently occur in the height change region due to each of the source electrode SE and the drain electrode DE may be prevented, whereby increase in manufacturing time and manufacturing cost may be prevented.

As is apparent from the foregoing description, TFT array substrates according to embodiments of the present invention include a data line including the plurality of the metal layers including a first metal layer and a second metal layer formed of Cu, and source and drain electrodes including the remaining metal layer excluding the second metal layer formed of Cu among the plurality of the metal layers.

That is, unlike the data line, the source and drain electrodes are formed so as to exclude the second metal layer formed of Cu as the uppermost layer and thus, even though an insulating film is formed weakly in the height change region due to each of the source and drain electrodes, Through Migration of Cu is prevented. Accordingly, short circuit between any one of the source and drain electrodes and a conductive layer formed on the insulating film (e.g., a gate electrode) due to the Through Migration of Cu may be prevented and thus reliability and yield of the transistor array substrates may be enhanced.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A thin film transistor (TFT) array substrate comprising:
a substrate;
a gate line formed on the substrate;
a first gate electrode formed on the substrate and branched from the gate line;
a gate insulating film formed over the substrate so as to cover the gate line and the first gate electrode;
an active layer formed on the gate insulating film so as to overlap with at least a portion of the first gate electrode;
a data line formed on the gate insulating film to cross the gate line, wherein the data line includes a plurality of metal layers comprising a first metal layer and a second metal layer formed of copper (Cu);
a source electrode formed on the gate insulating film and branched from the data line so as to overlap with a first side of the active layer, wherein the source electrode includes a remaining metal layer that excludes the second metal layer among the plurality of the metal layers;
a drain electrode formed on the gate insulating film and spaced apart from the source electrode so as to overlap with a second side of the active layer, wherein the drain electrode includes the remaining metal layer that excludes the second metal layer among the plurality of the metal layers;
an interlayer insulating film formed over the gate insulating film so as to cover the data line, the source electrode, and the drain electrode; and
a second gate electrode formed on the interlayer insulating film so as to overlap with at least a portion of the active layer and connected to the first gate electrode via a first contact hole penetrating the interlayer insulating film and the gate insulating film to expose a portion of the first gate electrode, wherein the second gate electrode does not overlap the gate line, and
wherein the second metal layer formed of copper is disposed over the first metal layer except areas in which the second gate electrode overlaps with the source electrode and the drain electrode.

2. The TFT array substrate according to claim 1, further comprising:
a pixel electrode formed on the interlayer insulating film and connected to the drain electrode via a second contact hole penetrating the interlayer insulating film to expose at least a portion of the drain electrode.

3. The TFT array substrate according to claim 1, wherein the first metal layer is formed of any one of molybdenum-titanium (MoTi), molybdenum (Mo), titanium (Ti), and chromium (Cr).

4. The TFT array substrate according to claim 3, wherein each of the source electrode and the drain electrode comprises the first metal layer as a single layer.

5. The TFT array substrate according to claim 1, wherein the active layer comprises any one of an oxide semiconductor, polysilicon, and amorphous silicon.

6. The TFT array substrate according to claim 5, further comprising an etch stopper formed on the active layer so as to cover a separation region between the source electrode and the drain electrode when the active layer is formed of the oxide semiconductor.

7. A method of manufacturing a TFT array substrate, the method comprising:
forming a gate line and a first gate electrode branched from the gate line on a substrate;
forming a gate insulating film covering the gate line and the first gate electrode over the substrate;
forming an active layer overlapping with at least a portion of the first gate electrode on the gate insulating film;
forming a plurality of metal layers comprising a first metal layer and a second metal layer formed of Cu on the gate insulating film;
forming a data line, a source electrode and a drain electrode on the gate insulating film by differently patterning the plurality of the metal layers, the data line crossing the gate line, the source electrode branched from the data line and overlapping with a first side of the active layer, and the drain electrode spaced apart from the source electrode and overlapping with a second side of the active layer;
forming an interlayer insulating film covering the data line, the source electrode, and the drain electrode over the gate insulating film;
forming a first contact hole and a second contact hole, the first contact hole penetrating the interlayer insulating film to expose at least a portion of the drain electrode, and the second contact hole penetrating the interlayer insulating film and the gate insulating film to expose a portion of the first gate electrode; and
forming a second gate electrode on the interlayer insulating film, the second gate electrode overlapping with at least a portion of the active layer and connected to the first gate electrode via the second contact hole, wherein the second gate electrode does not overlap the gate line,
wherein, in the forming of the data line, the source electrode and drain electrode, the data line is formed to comprise the plurality of the metal layers, and each of the source electrode and the drain electrode is formed to comprise a remaining metal layer that excludes the second metal layer among the plurality of the metal layers, and
wherein the second metal layer formed of copper is disposed over the first metal layer except areas in which the second gate electrode is overlapped with the source electrode and the drain electrode.

8. The method according to claim 7, wherein, in the forming of the second gate electrode, a pixel electrode connected to the drain electrode via the first contact hole is further formed on the interlayer insulating film.

9. The method according to claim 7, wherein, in the forming of the plurality of metal layers, the first metal layer is formed of any one of MoTi, Mo, Ti, and Cr.

10. The method according to claim 9, wherein, in the forming of the data line, each of the source electrode and the drain electrode comprises the first metal layer as a single layer.

11. The method according to claim 7, wherein the forming of the data line, the source electrode and the drain electrode comprises:
   forming a stepped mask on the plurality of the metal layers, wherein the stepped mask comprises a first pattern region corresponding to the data line and having a first thickness and a second pattern region corresponding to the source electrode and the drain electrode and having a second thickness that is smaller than the first thickness;
   forming the data line by patterning the plurality of the metal layers using the stepped mask;
   removing the second pattern region by ashing the stepped mask and forming the first pattern region to a third thickness that is smaller than the first thickness;
   forming the source electrode and the drain electrode by patterning the second metal layer among the metal layers using the first pattern region having the third thickness; and
   removing the first pattern region having the third thickness.

12. The method according to claim 7, wherein, in the forming of the active layer, the active layer is formed of any one of an oxide semiconductor, polysilicon, and amorphous silicon.

13. The method according to claim 12, further comprising, when the active layer is formed of the oxide semiconductor, forming an etch stopper on the active layer, the etch stopper covering a separation region between the source electrode and the drain electrode before the forming of the plurality of metal layers.

* * * * *